US010793017B2

United States Patent
Lee

(10) Patent No.: US 10,793,017 B2
(45) Date of Patent: Oct. 6, 2020

(54) CIRCUIT FAILURE DETECTOR, ELECTRIC VEHICLE CHARGING CONTROLLER INCLUDING SAME, AND CIRCUIT FAILURE DETECTION METHOD

(71) Applicant: LG INNOTEK CO., LTD., Seoul (KR)

(72) Inventor: Kwan Soo Lee, Seoul (KR)

(73) Assignee: LG INNOTEK CO., LTD., Seoul (KR)

( * ) Notice: Subject to any disclaimer, the term of this patent is extended or adjusted under 35 U.S.C. 154(b) by 55 days.

(21) Appl. No.: 16/322,358

(22) PCT Filed: Aug. 8, 2017

(86) PCT No.: PCT/KR2017/008545
§ 371 (c)(1),
(2) Date: Jan. 31, 2019

(87) PCT Pub. No.: WO2018/030749
PCT Pub. Date: Feb. 15, 2018

(65) Prior Publication Data
US 2019/0176654 A1    Jun. 13, 2019

(30) Foreign Application Priority Data

Aug. 11, 2016  (KR) .................. 10-2016-0102391

(51) Int. Cl.
*G01R 31/00* (2006.01)
*B60L 53/60* (2019.01)
(Continued)

(52) U.S. Cl.
CPC ................ *B60L 53/60* (2019.02); *B60L 3/00* (2013.01); *B60L 50/50* (2019.02); *G01R 19/165* (2013.01);
(Continued)

(58) Field of Classification Search
CPC ...... G01R 31/006; G01R 31/50; G01R 31/52; G01R 31/007; G01R 31/54; G01R 31/008; G01R 31/005; G01R 35/00
(Continued)

(56) References Cited

U.S. PATENT DOCUMENTS

| 2002/0180540 | A1* | 12/2002 | Hirai | ........................ | H03L 7/18 |
| | | | | | 331/100 |
| 2012/0075137 | A1* | 3/2012 | Tanizawa | ............ | H03M 1/0621 |
| | | | | | 341/157 |
| 2012/0105107 | A1* | 5/2012 | Moon | .................... | H03D 13/00 |
| | | | | | 327/40 |

FOREIGN PATENT DOCUMENTS

| JP | 10-062458 A | 3/1998 |
| JP | 2015-091157 A | 5/2015 |

(Continued)

OTHER PUBLICATIONS

International Search Report in International Application No. PCT/KR2017/008545, filed Aug. 8, 2017.

*Primary Examiner* — Raul J Rios Russo
(74) *Attorney, Agent, or Firm* — Saliwanchik, Lloyd & Eisenschenk

(57) ABSTRACT

The present invention relates to a circuit failure detector comprising: an input terminal for receiving a detection signal having a first frequency from an interlock circuit; a correction circuit for correcting the voltage of the received detection signal; a first comparator comparing the corrected detection signal with a first reference voltage and outputting a high voltage signal or a low voltage signal; a second comparator inverting the corrected detection signal, comparing the inverted detection signal with a second reference voltage, and outputting the high voltage signal or the low voltage signal; a counting signal generator for generating a counting signal having a second frequency; a first coupler (Continued)

for coupling an output signal of the first comparator with the counting signal; a second coupler for coupling the output signal of the second comparator with the counting signal; and a controller for detecting a circuit failure on the basis of the output signal of the first coupler and the output signal of the second coupler.

15 Claims, 11 Drawing Sheets

(51) Int. Cl.

| | | |
|---|---|---|
| *B60L 3/00* | (2019.01) | |
| *G01R 19/252* | (2006.01) | |
| *B60L 50/50* | (2019.01) | |
| *G01R 19/165* | (2006.01) | |
| *G01R 31/50* | (2020.01) | |
| *G01R 31/52* | (2020.01) | |
| *G01R 31/54* | (2020.01) | |
| *G01R 35/00* | (2006.01) | |

(52) U.S. Cl.
CPC ....... *G01R 19/1659* (2013.01); *G01R 19/252* (2013.01); *G01R 31/00* (2013.01); *G01R 31/005* (2013.01); *G01R 31/006* (2013.01); *G01R 31/007* (2013.01); *G01R 31/008* (2013.01); *G01R 31/50* (2020.01); *G01R 31/52* (2020.01); *G01R 31/54* (2020.01); *G01R 35/00* (2013.01); *B60Y 2200/91* (2013.01); *Y02T 10/7005* (2013.01)

(58) Field of Classification Search
USPC .................................. 324/158, 378, 500, 503
See application file for complete search history.

(56) References Cited

FOREIGN PATENT DOCUMENTS

| | | |
|---|---|---|
| JP | 2016-506612 A | 3/2016 |
| KR | 10-1999-0021652 A | 3/1999 |
| KR | 10-2011-0076859 A | 7/2011 |
| KR | 10-2011-0122302 A | 11/2011 |
| KR | 10-2013-0142909 A | 12/2013 |

\* cited by examiner

US 10,793,017 B2

CIRCUIT FAILURE DETECTOR, ELECTRIC VEHICLE CHARGING CONTROLLER INCLUDING SAME, AND CIRCUIT FAILURE DETECTION METHOD

CROSS-REFERENCE TO RELATED APPLICATIONS

This application is the U.S. national stage application of International Patent Application No. PCT/KR2017/008545, filed Aug. 8, 2017, which claims the benefit under 35 U.S.C. § 119 of Korean Application No. 10-2016-0102391, filed Aug. 11, 2016, the disclosures of each of which are incorporated herein by reference in their entirety.

TECHNICAL FIELD

The present invention relates to a circuit failure detector, including an input terminal receiving a detection signal having a first frequency from an interlock circuit, a correction circuit correcting a voltage of the input detection signal, a first comparator outputting a high voltage signal or a low voltage signal by comparing the corrected detection signal with a first reference voltage, a second comparator inverting the corrected detection signal and outputting a high voltage signal or a low voltage signal by comparing the inverted detection signal with a second reference voltage, a counting signal generator generating a counting signal having a second frequency, a first coupler coupling the output signal of the first comparator and the counting signal, a second coupler coupling the output signal of the second comparator and the counting signal, and a controller detecting a circuit failure based on an output signal of the first coupler and an output signal of the second coupler.

BACKGROUND ART

An electric vehicle is a vehicle obtaining driving energy of the vehicle from electric energy not by the combustion of fossil fuel. Such an electric vehicle has excellent no-pollution and eco-friendly advantages because it absolutely has no exhaust gas and has very small noise. However, the electric vehicle essentially requires a battery, that is, the supply source of energy, and the commercialization of the electric vehicle is delayed due to the light-weight/small size and short charging time of the battery.

Meanwhile, for the infrastructure construction of the electric vehicle, charging stations must be installed nationwide. Like a conventional gas station used by a vehicle, the charging station can supply a power source to a battery, that is, the energy source of the electric vehicle. Recently many charging stations are deployed along the rapid supply of electric vehicles.

In this case, if the electric vehicle is connected to the charging station and performs charging or discharging, a charging closed loop generated in the charging or discharging process may be formed. Through the charging closed loop, the charging station may supply power to the electric vehicle and the electric vehicle may be discharged toward the charging station.

However, in the process of the electric vehicle being charged or discharged in the charging station, various failure modes, such as a short, an open, a short circuit, a battery short and a ground (vehicle body) short, may occur. Referring to FIG. 1, in the case of a conventional electric vehicle, a one-way loop interrupt detection method is used to detect a failure mode.

Furthermore, referring to FIG. 1, the conventional electric vehicle further includes a fuse 110 between internal control parts (ECU, etc.), and detects a failure occurrence by opening the fuse part when a failure mode attributable an overcurrent occurs.

In such a conventional failure mode processing method, however, there is inconvenience that a fuse must be replaced each time because the fuse is open when a failure mode occurs. There is a problem in that a failure mode cannot be detected when an overcurrent does not flow to the extent that the fuse is suspended. Furthermore, there is a disadvantage in that failure diagnosis cannot be performed although a failure occurs in a high-voltage interlock (HVIL) module itself.

DISCLOSURE

Technical Problem

In order to solve the disadvantages of a conventional electric vehicle failure mode detector as described above, an object of the present invention is to provide a circuit failure detector capable of detecting a circuit failure through two types of output signals using a first comparator and a second comparator and differentially detecting various failure modes.

Technical objects to be achieved by the present invention are not limited to the above-described objects, and may include various technical objects within the range evident to those skilled in the art from the following description.

Technical Solution

A circuit failure detector according to an embodiment of the present invention for achieving the objects may include an input terminal receiving a detection signal having a first frequency from an interlock circuit; a correction circuit correcting a voltage of the input detection signal by adding an offset voltage to a voltage of the input detection signal; a first comparator outputting a high voltage signal or a low voltage signal by comparing the corrected detection signal with a first reference voltage; a second comparator inverting the corrected detection signal and outputting a high voltage signal or a low voltage signal by comparing the inverted detection signal with a second reference voltage; a counting signal generator generating a counting signal having a second frequency; a first coupler coupling the output signal of the first comparator and the counting signal; a second coupler coupling the output signal of the second comparator and the counting signal; and a controller detecting a circuit failure based on an output signal of the first coupler and an output signal of the second coupler. In one embodiment of the present invention, the controller may detect that the interlock circuit is a normal state when the output signal of the first coupler and the output signal of the second coupler are preset values or more.

In one embodiment of the present invention, the controller may detect that the interlock circuit is a circuit failure of an open state when the output signal of the first coupler and the output signal of the second coupler are low voltage signals.

In one embodiment of the present invention, the controller may detect that the interlock circuit is a circuit failure of a battery-short state when an output signal of the first coupler is a preset value or more and an output signal of the second coupler is a low voltage signal.

In one embodiment of the present invention, the controller may detect that the interlock circuit is a circuit failure of a ground (GND)-short state when the output signal of the first coupler is a low voltage signal and the output signal of the second coupler is a preset value or more.

In one embodiment of the present invention, the controller may detect that the interlock circuit is a failure when the second frequency of the output signal of the first coupler or the output signal of the second coupler exceeds a preset range.

Furthermore, the circuit failure detector according to an embodiment of the present invention may further include a given detection signal generator generating a given detection signal having the first frequency and inputting the given detection signal to the input terminal.

In one embodiment of the present invention, the controller may detect a circuit failure based on the output signal of the first coupler or output signal of the second coupler generated based on the given detection signal.

A circuit failure detection method using a circuit failure detector including an input terminal, a correction circuit, a first comparator, a second comparator, a counting signal generator, a first coupler, a second coupler and a controller according to another embodiment of the present invention may include the steps of (a) inputting a detection signal having a first frequency from an interlock circuit to the input terminal; (b) correcting, by the correction circuit, a voltage of the detection signal by adding an offset voltage to a voltage of the input detection signal; (c) comparing, by the first comparator, the corrected detection signal with a first reference voltage and outputting a high voltage signal or a low voltage signal; (d) inverting, by the second comparator, the corrected detection signal, comparing the inverted detection signal with a second reference voltage, and outputting a high voltage signal or a low voltage signal; (e) generating, by the counting signal generator, a counting signal having a second frequency; (f) coupling, by the first coupler, the output signal of the first comparator and the counting signal; (g) coupling, by the second coupler, the output signal of the second comparator and the counting signal; and (h) detecting, by the controller, a circuit failure based on an output signal of the first coupler and an output signal of the second coupler.

In the circuit failure detection method according to an embodiment of the present invention, in the step (h), the interlock circuit may be detected as being a normal state when the output signal of the first coupler and the output signal of the second coupler are preset values or more.

In the circuit failure detection method according to an embodiment of the present invention, in the step (h), the interlock circuit may be detected as being a circuit failure of an open state when the output signal of the first coupler and the output signal of the second coupler are low voltage signals.

In the circuit failure detection method according to an embodiment of the present invention, in the step (h), the interlock circuit may be detected as being a circuit failure of a battery-short state when an output signal of the first coupler is a preset value or more and an output signal of the second coupler is a low voltage signal.

In the circuit failure detection method according to an embodiment of the present invention, in the step (h), the interlock circuit may be detected as being a circuit failure of a ground (GND)-short state when the output signal of the first coupler is a low voltage signal and the output signal of the second coupler is a preset value or more.

In the circuit failure detection method according to an embodiment of the present invention, in the step (h), the interlock circuit may be detected as being a failure when a second frequency of an output signal of the first coupler or output signal of the second coupler exceeds a preset range.

An electric vehicle charging controller according to yet another embodiment of the present invention includes a circuit failure detector; a power connector receiving power from an electric vehicle charging station; a relay circuit connected to the power connector; and a power supply circuit connected to the relay circuit to supply power to a battery of an electric vehicle. The circuit failure detector includes an input terminal receiving a detection signal having a first frequency from an interlock circuit; a correction circuit correcting a voltage of the input detection signal; a first comparator outputting a high voltage signal or a low voltage signal by comparing the corrected detection signal with a first reference voltage; a second comparator inverting the corrected detection signal and outputting a high voltage signal or a low voltage signal by comparing the inverted detection signal with a second reference voltage; a counting signal generator generating a counting signal having a second frequency; a first coupler coupling the output signal of the first comparator and the counting signal; a second coupler coupling the output signal of the second comparator and the counting signal; and a controller detecting a circuit failure based on an output signal of the first coupler and an output signal of the second coupler. When the controller detects a circuit failure, the switch of the relay circuit may be open.

Advantageous Effects

The circuit failure detector of the present invention and the electric vehicle charging controller including the same can receive a detection signal to detect a closed loop state in the charging or discharging process of an electric vehicle, and can detect a failure mode of the electric vehicle by identifying an output signal of the coupler coupled to the output signals of the first comparator and the second comparator to be four states.

Furthermore, the circuit failure detector of the present invention and the electric vehicle charging controller including the same can differentially detect failure modes of four states of a normal state, a battery-short state, a GND-short state, and an open state.

Furthermore, the circuit failure detector of the present invention and the electric vehicle charging controller including the same can provide convenience of failure diagnosis because they can distinguish between the failure modes.

Furthermore, the circuit failure detector of the present invention and the electric vehicle charging controller including the same can detect a failure mode for an HVIL signal loss by autonomously generating a given detection signal without receiving a detection signal generated by an electric vehicle.

Furthermore, the circuit failure detector of the present invention and the electric vehicle charging controller including the same can reduce a failure repair cost compared to a disposable fuse because a separate controller is included without using a fuse and the controller opens a relay circuit when detecting a circuit failure. Furthermore, when a failure mode returns to a normal mode, a normal operation can be performed without separate measures even without a loss of a related part (fuse, etc.).

Furthermore, the circuit failure detector of the present invention and the electric vehicle charging controller including the same can reduce a failure itself because a circuit configuration is simple.

Furthermore, the circuit failure detector of the present invention and the electric vehicle charging controller including the same do not require a separate design change according to a signal configuration of an electric vehicle, and may be configured in a module-independent form and an electric vehicle association form and mounted and used.

BEST MODE FOR INVENTION

Hereinafter, a "circuit failure detector and an electric vehicle charging controller including the same" according to the present invention are described in detail with reference to the accompanying drawings. The embodiments are provided so that those skilled in the art may easily understand the technical spirit of the present invention and the present invention is not restricted by the embodiments. Furthermore, contents described in the accompanying drawings have been diagrammed in order to easily describe the embodiments of the present invention, and may be different from forms that are actually implemented.

Elements to be described herein are only examples for implementing the embodiments of the present invention. Accordingly, in other implementations of the present invention, different elements may be used without departing from the spirit and scope of the present invention.

Furthermore, an expression that some elements are "included" is an expression of an "open type", and the expression simply denotes that the corresponding elements are present, but should not be construed as excluding additional elements.

Furthermore, expressions, such as "the first" and "the second", are used to only distinguish between a plurality of elements and do not limit the sequence or other characteristics of the elements.

In the description of the present invention, when it is said that each layer (or film), area, pattern or structure is formed "over/on" or "under/below" each substrate, layer (or film), area, pad or structure, this includes both expressions, including that one element is directly formed on the other element and that a third element is interposed between the two elements. A criterion for the term "over/on" or "under/below" of each layer is described based on the drawings.

When it is described that one part is "connected" to the other part, the one part may be "directly connected" to the other part or may be "indirectly connected" to the other part through a third part. Furthermore, when it is said that one part "includes" the other part, the word "include (or comprise)" will be understood to imply the inclusion of stated parts but not the exclusion of any other parts, unless explicitly described to the contrary.

Figure 1:
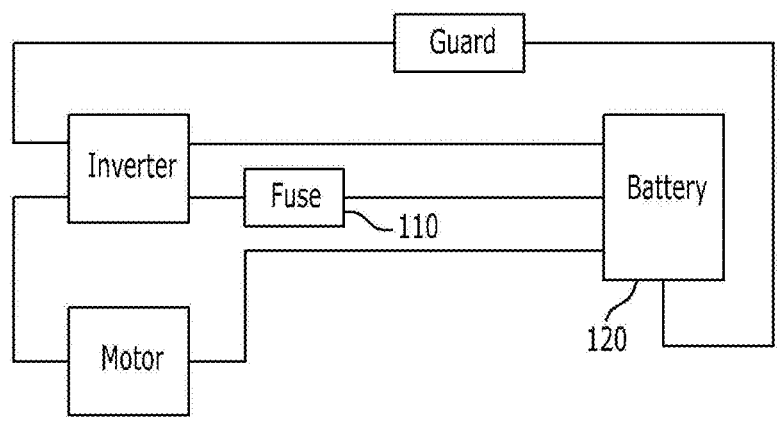
FIG. 1 relates to an embodiment of a conventional electric vehicle failure mode prevention circuit.
Figure 2:
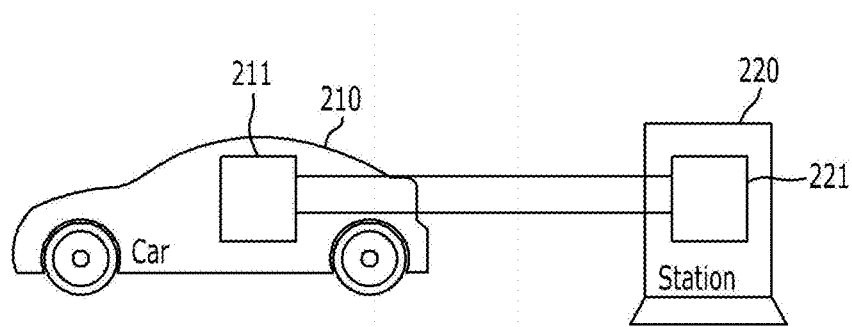
FIG. 2 relates to the configuration of a circuit failure detector and an electric vehicle according to an embodiment of the present invention.
Figure 3:
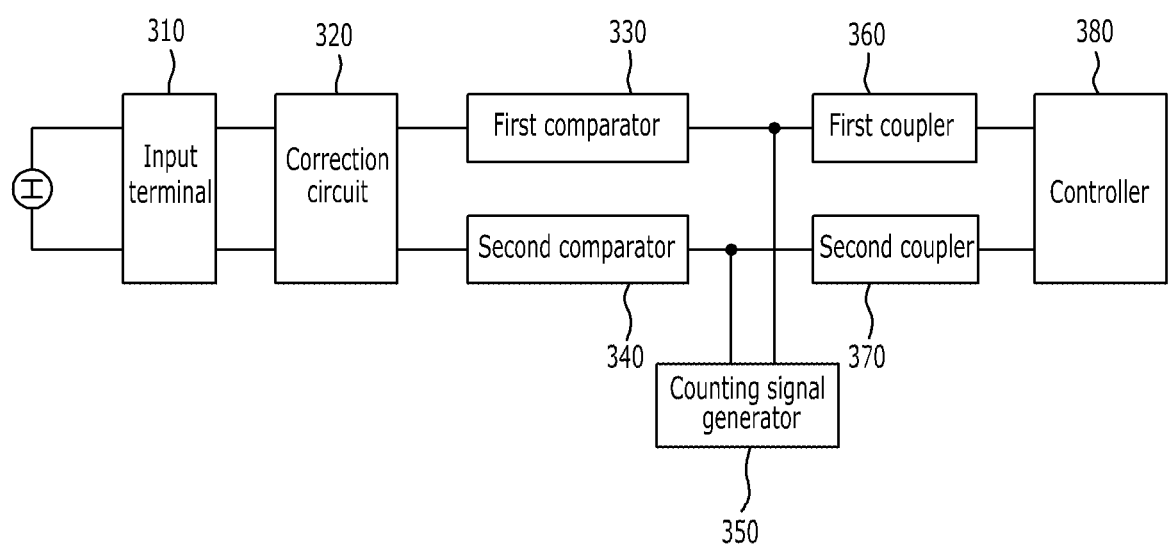
FIG. 3 relates to the configuration of a circuit failure detector according to an embodiment of the present invention.

FIG. 2 relates to the configuration of a circuit failure detector and an electric vehicle according to an embodiment of the present invention. FIG. 3 relates to the configuration of a circuit failure detector according to an embodiment of the present invention.

Referring to FIGS. 2 and 3, when the electric vehicle 210 is connected to a charging station 220 and performs charging or discharging, power or a voltage supplied by the charging station 220 is applied to various parts (inverter, motor, PDU, insulation protector, charging battery) included in the electric vehicle 210 without any change. Specifically, the parts included in the electric vehicle may include various complicated circuits. Accordingly, when an overvoltage or an overcurrent is applied to the circuits, there is a danger that an overall operation of the electric vehicle may be stopped.

The circuit failure detector according to an embodiment of the present invention determines a circuit failure by detecting the state of a voltage applied to several portions of various electronic parts included in the electric vehicle. More specifically, the circuit failure detector of the present invention is preferably positioned within the electric vehicle, and can inhibit a failure mode of the electric vehicle under the control of an electric vehicle charging controller. The circuit failure detector is connected to a relay circuit and protects the parts of the electric vehicle by opening a closed loop circuit.

Figure 4:
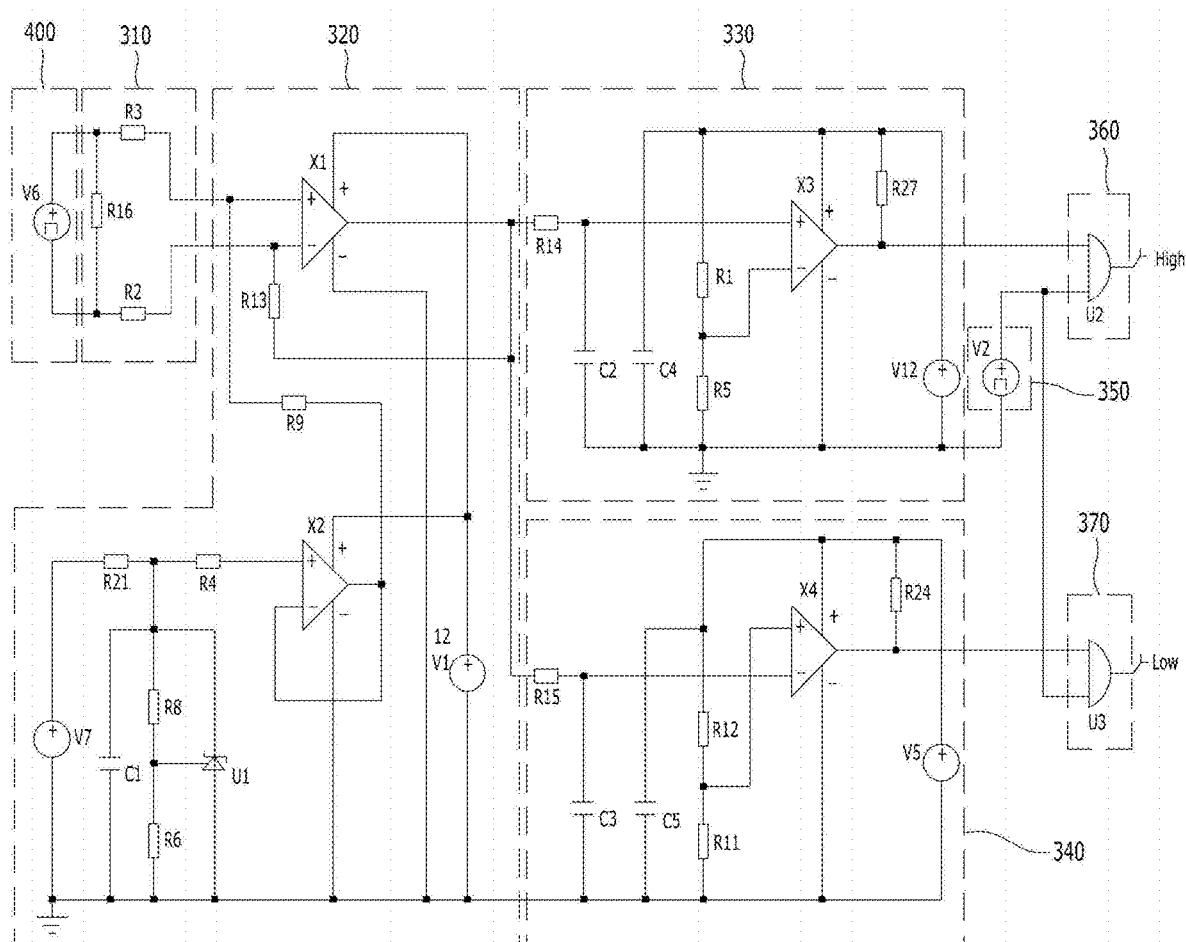
FIG. 4 relates to the circuit diagram of the circuit failure detector according to an embodiment of the present invention.

FIG. 4 relates to the circuit diagram of the circuit failure detector according to an embodiment of the present invention.

Referring to FIGS. 3 and 4, the circuit failure detector of the present invention may include an input terminal 310, a correction circuit 320, a first comparator 330, a second comparator 340, a counting signal generator 350, a first coupler 360, a second coupler 370, and a controller 380.

The input terminal 310 may receive a detection signal having a first frequency from an interlock circuit. In an electric vehicle, various failure modes, such as a movement of the vehicle, the abnormality of a charging station, and damage to a circuit within the vehicle, may occur in a connection state with the charging station. The electric vehicle may include the interlock circuit in order to inhibit a loss of the electric vehicle occurring due to such failure modes.

In this case, the interlock circuit may generate a detection signal having a first frequency by detecting the state of several parts of the electric vehicle. Furthermore, such a detection signal includes a pulse width modulation (PWM)

signal, and may be represented by modulating various states through the conversion of a duty. More specifically, the detection signal may have a square wave having a first frequency 88 Hz and a duty 50%.

The detection signal input to the input terminal passes through the correction circuit, the comparators, and the couplers, so a failure mode can be determined based on an output signal.

The correction circuit 320 may correct a voltage of an input detection signal. If the detection signal is used without any change, an error of the corresponding detection signal may not be properly measured in the comparator or the controller. The correction circuit of the present invention corrects a voltage of the detection signal so that a circuit failure is easily detected, and uses the corrected signal.

More specifically, the correction circuit 320 of the present invention may correct the voltage of the input detection signal by adding an offset voltage to the voltage. In the case of a battery included in an electric vehicle in which the circuit failure detector of the present invention is positioned, the correction circuit 320 may correct the detection signal using a battery voltage because the battery voltage swings between 9~16 V. Accordingly, the correction circuit of the present invention can correct an input detection signal into a preset square wave by offsetting the input detection signal to a battery voltage or a given setting voltage.

More specifically, the correction circuit 320 of the present invention may include an operational amplifier for receiving a battery voltage adjusted to a given value based on a voltage distribution, an operational amplifier for receiving the output value of the operational amplifier and a detection signal applied by the input terminal, multiple resistors for adjusting other voltage values, capacitors for charging, noise elimination and the stabilization of a circuit, and so on.

The comparator is a circuit for comparing one voltage with the other voltage, and is a device for receiving an input voltage, detecting whether the input voltage exceeds a reference voltage by comparing the input voltage with the reference voltage, and outputting the results of the comparison as a digital (low, high) value. Furthermore, the comparator of the present invention may compare the size of the input voltage with the size of the reference voltage and output one of the input voltage and the reference voltage.

The first comparator 330 of the present invention may compare a corrected detection signal with a first reference voltage and output a high voltage signal or a low voltage signal. Furthermore, the second comparator 340 of the present invention may invert the corrected detection signal, may compare the inverted detection signal with a second reference voltage, and may output a high voltage signal or a low voltage signal.

More specifically, the first comparator 330 and second comparator 340 of the present invention may include an operational amplifier for receiving a corrected detection signal and comparing the received detection signal with a first reference voltage, multiple resistors for generating a voltage adjusted to a given value based on a voltage distribution, capacitors for charging, noise elimination and the stabilization of a circuit, and so on.

In this case, each of the first comparator 330 and the second comparator 340 receives an inverted signal and compares the inverted single with a reference voltage. Referring to FIG. 4, a corrected detection signal input to the first comparator is applied to the (+) input terminal of the operational amplifier, whereas a corrected detection signal input to the second comparator is applied to the (−) input terminal of the operational amplifier. Accordingly, signals output by the first comparator and the second comparator have inverted values, so circuit failures having failure modes of different states can be effectively identified based on the output signal values.

Furthermore, the first reference voltage of the first comparator of the present invention may be lower than the second reference voltage of the second comparator. In the present invention, an output signal may be generated using the second reference voltage lower than the first reference voltage because a detection signal applied to the first comparator is inverted and applied to the second comparator.

For example, a resistor connected to the operational amplifier may be configured so that the first reference voltage of the present invention has a ⅔ size of a battery voltage. A resistor connected to the operational amplifier may be configured so that the second reference voltage has a ⅓ size of a battery voltage.

Furthermore, the first comparator 330 of the present invention may output the corrected detection signal when the corrected detection signal is higher than the first reference voltage. Furthermore, the second comparator 340 of the present invention may output the inverted detection signal when the inverted detection signal is lower than the second reference voltage.

Furthermore, the comparator 330, 340 of the present invention may output a high voltage signal (High) or a low voltage signal (Low) depending on the + or − of a compared value when the value is compared with a reference voltage. However, when the value is higher or lower than the reference voltage, the comparator may output a corresponding input signal without any change. Accordingly, the first comparator and second comparator of the present invention may output a corrected detection signal received after it is compared with a reference voltage.

The counting signal generator 350 may generate a counting signal having a second frequency. The counting signal is coupled with a detection signal by the coupler so that the controller detects a circuit failure based on the final output signal. A circuit failure may be detected using only a detection signal. In this case, various states may not be differentially determined because an output signal has only a high voltage (High) or low voltage (Low) state value. Accordingly, the circuit failure detector of the present invention further includes the counting signal generator 350, and thus can effectively detect a circuit failure based on a detection signal coupled with a counting signal.

In this case, the second frequency of the counting signal may be higher than the first frequency. For example, the second frequency of the present invention may be a frequency of about 10 kHz, and the first frequency may have a frequency of 88 Hz.

The first coupler 360 may couple the output signal of the first comparator 330 and the counting signal. The second coupler 370 may couple the output signal of the second comparator 340 and the counting signal. As described above, the final output signal having the first frequency and the second frequency may be generated by coupling a signal output by the comparator 330, 340 and the counting signal. In this case, the coupler 360, 370 may include an AND gate.

Figure 5A:
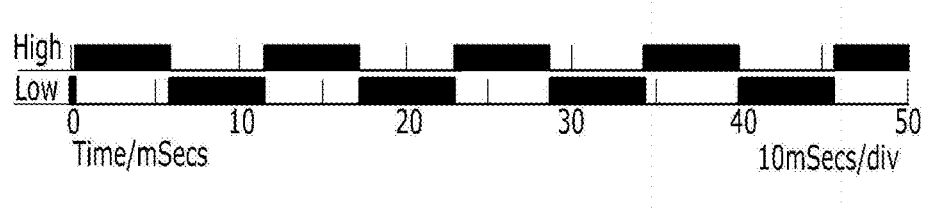
FIGS. 5a and 5b are graphs of an output signal for the normal state of the circuit failure detector according to an embodiment of the present invention.
Figure 5B:
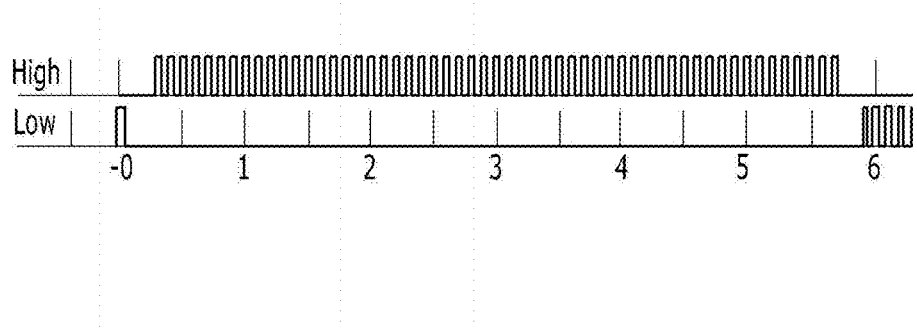

From FIGS. 5a and 5b, the final output signal of a detection signal coupled with a counting signal may be seen. When the scale of the horizontal axis (time) of FIG. 5a is expanded and viewed, it may be seen that 1/0/1/0 states alternate like the second frequency of the counting signal during the high period of the first frequency of the detection signal.

The controller 380 may detect a circuit failure based on the output signal of the first coupler 360 and the output signal of the second coupler 370. More specifically, the controller detect the output signal of the first coupler 360 and the output signal of the second coupler 370, and determines whether a circuit has fails by identifying the state of a corresponding output signal. In this case, the controller detects a circuit failure by detecting the output signal of the first coupler 360 as a high state and the output signal of the second coupler 370 as a low state.

Referring to FIG. 5a, the controller 380 of the present invention may detect that the interlock circuit is a normal state when the output signal of the first coupler 360 and the output signal (e.g., pulse count, FIG. 5b) of the second coupler 370 is a preset value or more. When the charging closed loop of an electric vehicle is a normal state, an input detection signal alternately has high and low states normally. Accordingly, the controller 380 of the present invention may identify that the output signal of the first coupler and the output signal of the second coupler normally have a given value (high value) or more, and may detect that the interlock circuit is a normal state.

From FIG. 5b, it may be seen that the controller 380 of the present invention couples and counts the signals of a higher frequency in order to identify that the high and low signals of FIG. 5a are alternated.

When the results of 0~6.3 time of FIG. 5a are expanded, it may be seen that high frequency signals have been coupled as in FIG. 5b. The controller 380 of the present invention may detect a circuit failure by counting the output signal (high-side pulse of FIG. 5b) of the first coupler 360 and counting the output signal (low-side pulse of FIG. 5b) of the second coupler 370. The controller may identify whether an input signal of a normal duty is received by counting the number of pulses.

Figure 6A:
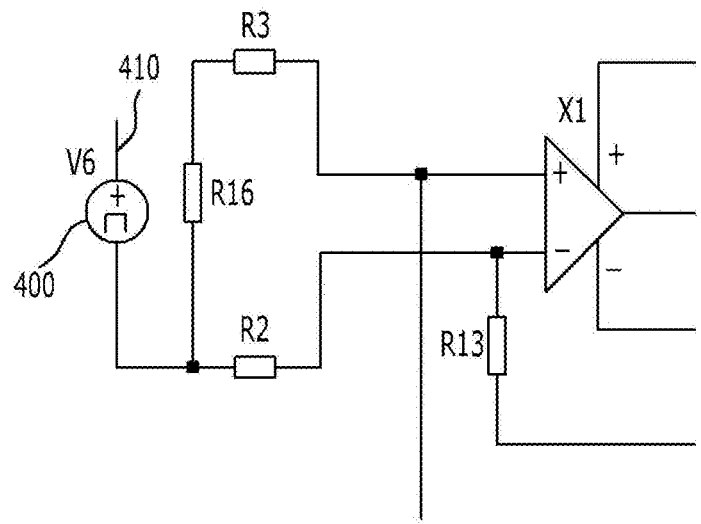
FIGS. 6a and 6b relate to circuit diagrams for the open state of an electric vehicle according to another embodiment of the present invention.
Figure 6B:
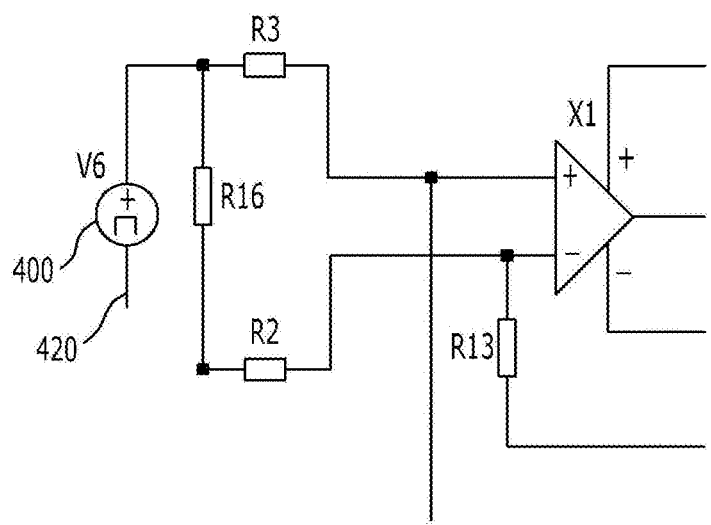
Figure 7:
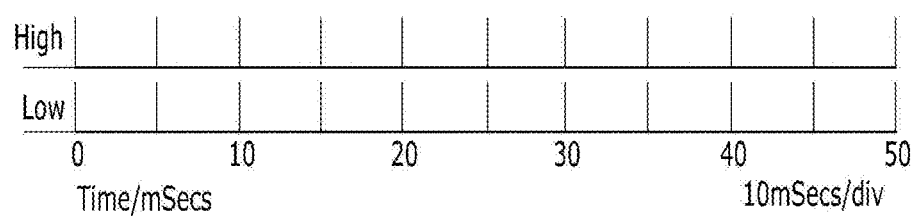
FIG. 7 is a graph of the output signal of the circuit failure detector in the open state of an electric vehicle according to another embodiment of the present invention.

FIGS. 6a and 6b relate to circuit diagrams for the open state of an electric vehicle according to another embodiment of the present invention. FIG. 7 is a graph of the output signal of the circuit failure detector in the open state of an electric vehicle according to another embodiment of the present invention.

Referring to FIGS. 6a, 6b and 7, the controller 380 of the present invention may detect that the interlock circuit is a circuit failure of an open state when the output signal of the first coupler and the output signal of the second coupler are low voltage signals.

When the interlock circuit is an open state, this means that a detection signal 400 applied by the interlock circuit is not connected to any one of both input terminals. An overall open state 410, 420 of an electric vehicle may be represented as the circuit of FIG. 6a or 6b. It may be said that a failure mode of an open state has occurred in a part that belongs to various parts of an electric vehicle and that is detected by the circuit failure detector of the present invention.

From FIG. 7, the states of the output signal of the first coupler 360 and the output signal of the second coupler 370 of the present invention may be seen when the interlock circuit is an open state. When the interlock circuit is the open state, the detection signal 400 is no longer input to the input terminal of the interlock circuit. Accordingly, both the first coupler and the second coupler output a low voltage signal 0. Accordingly, the controller of the present invention may detect that the parts of an electric vehicle are an open state by detecting that all the output signals have low voltage signals.

Figure 8A:
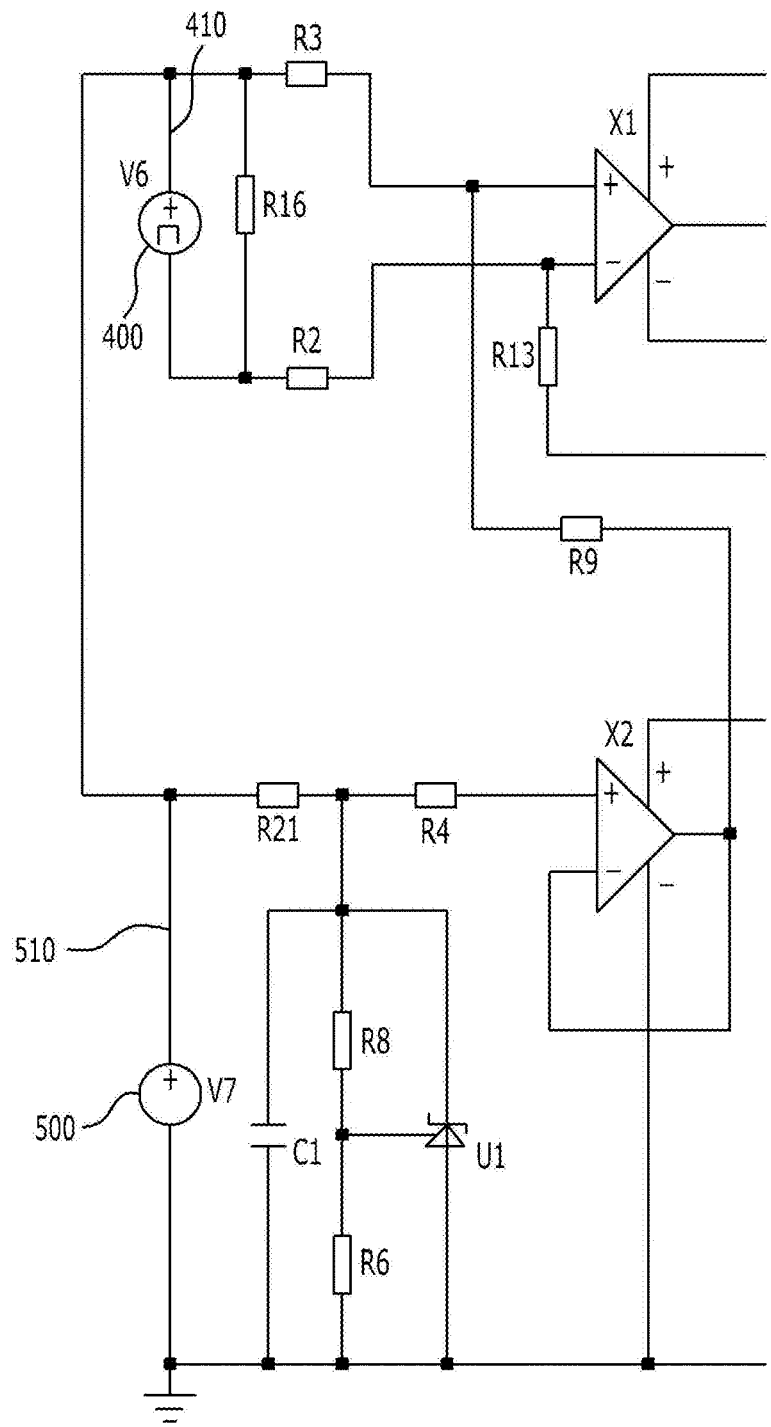
FIGS. 8a and 8b relate to the circuit diagrams for the battery-short state of an electric vehicle according to another embodiment of the present invention.
Figure 8B:
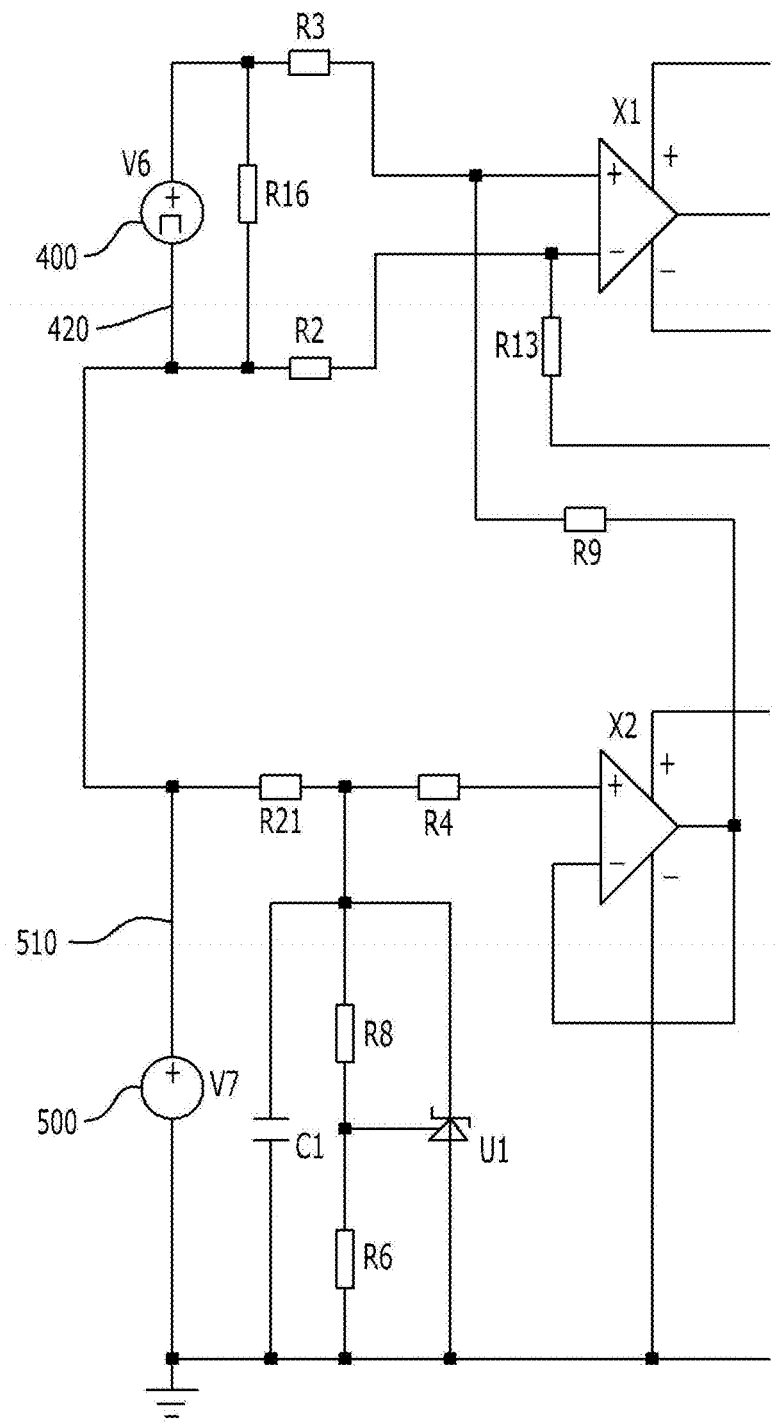
Figure 9:
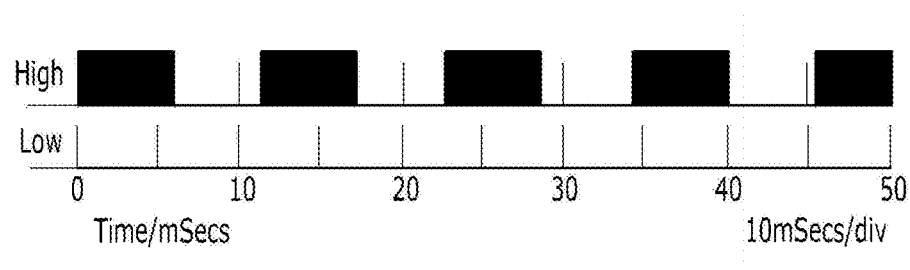
FIG. 9 is a graph of an output signal of the circuit failure detector in the battery-short state of an electric vehicle according to another embodiment of the present invention.

FIGS. 8a and 8b relate to the circuit diagrams for the battery-short state of an electric vehicle according to another embodiment of the present invention. FIG. 9 is a graph of an output signal of the circuit failure detector in the battery-short state of an electric vehicle according to another embodiment of the present invention.

Referring to FIGS. 8a, 8b and 9, the controller of the present invention may detect that the interlock circuit is a circuit failure of a battery-short state when the output signal of the first coupler is a preset value or more and the output signal of the second coupler is a low voltage signal.

The interlock circuit is positioned within an electric vehicle, and thus may be the battery-short state in which the power input node 510 of a battery 500 and the interlock circuit 410, 420 are short-circuited. This means that the power input node 510 of the battery 500 has been connected to any one of both the ends 410 and 420 of the input terminal. Accordingly, an overall battery-short state of the electric vehicle may be represented as the circuit of FIG. 8a or 8b. Accordingly, it may be said that a part that belongs to various parts included in the electric vehicle and that is detected by the circuit failure detector of the present invention is a failure mode of the battery-short state in which the part and the battery are shorted.

From FIG. 9, the output signal of the first coupler and the output signal of the second coupler of the present invention may be seen when the interlock circuit is the battery-short state. In the case of the battery-short state, the first coupler outputs a high state of a preset value or more, and thus the second coupler outputs a low voltage signal 0. Accordingly, the controller of the present invention may detect that a part of an electric vehicle is the battery-short state by detecting the output signals of the first coupler and the second coupler.

Figure 10A:
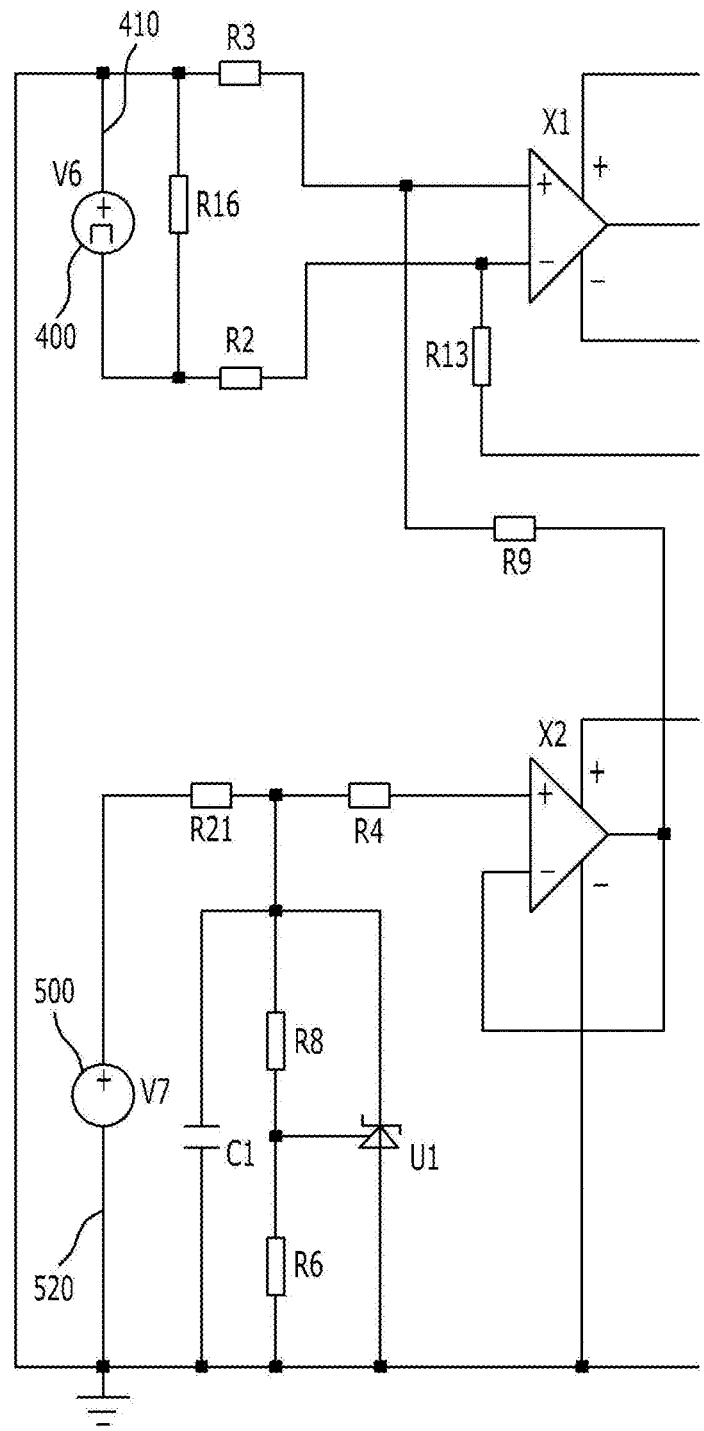
FIGS. 10a and 10b relate to the circuit diagrams of the GND-short state of an electric vehicle according to another embodiment of the present invention.
Figure 10B:
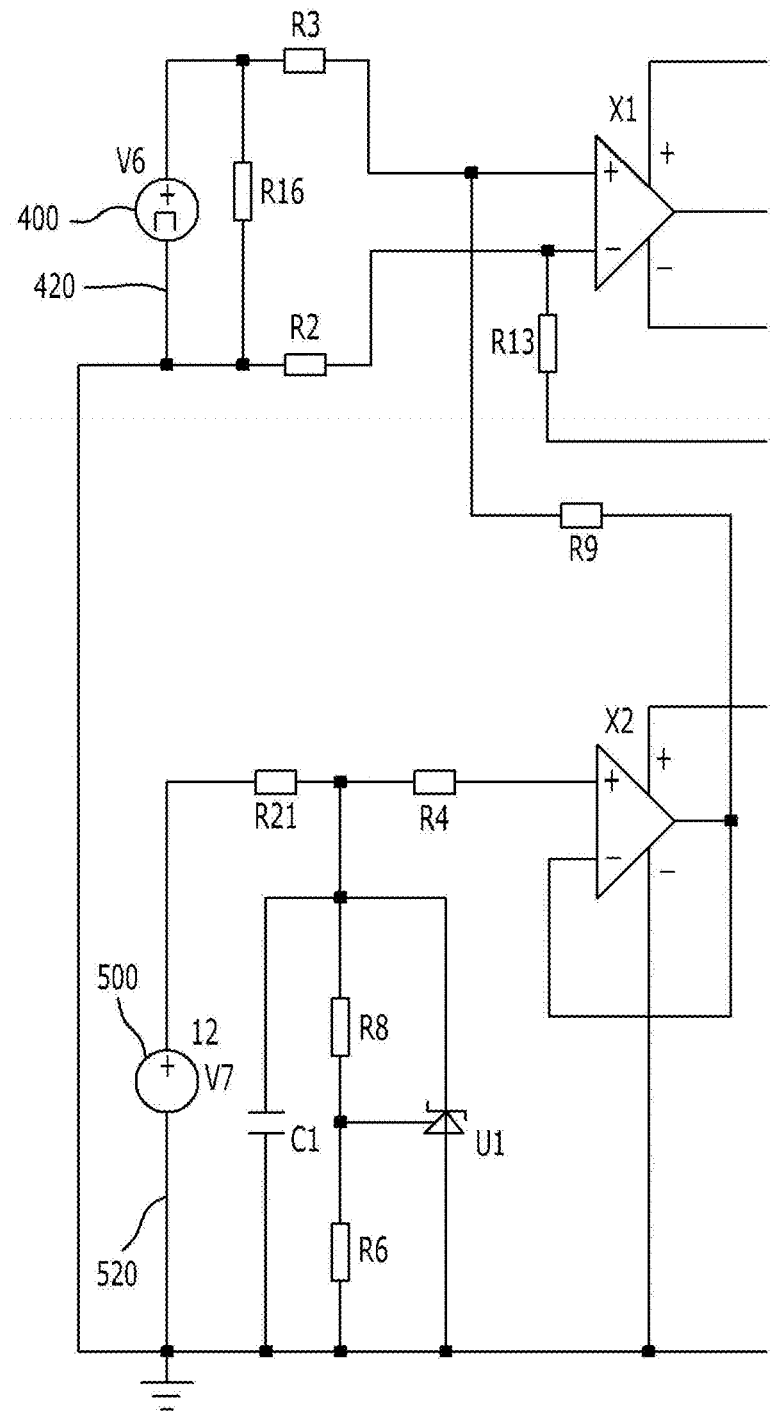
Figure 11:
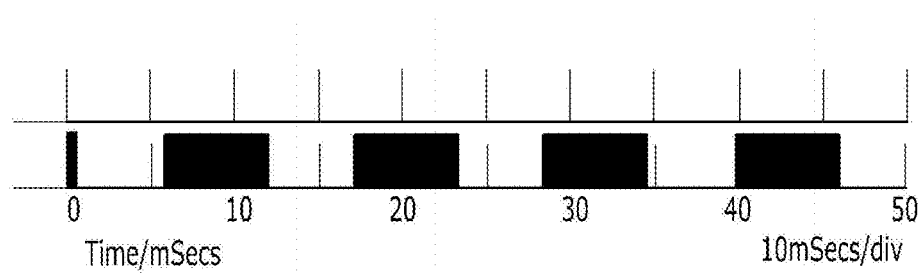
FIG. 11 is a graph of am output signal of the circuit failure detector in the GND-short state of an electric vehicle according to another embodiment of the present invention.

FIGS. 10a and 10b relate to the circuit diagrams of the GND-short state of an electric vehicle according to another embodiment of the present invention. FIG. 11 is a graph of am output signal of the circuit failure detector in the GND-short state of an electric vehicle according to another embodiment of the present invention.

Referring to FIGS. 10a, 10b and 11, the controller of the present invention may detect that the interlock circuit is a circuit failure of a ground (GND)-short state when the output signal of the first coupler is a low voltage signal and the output signal of the second coupler is a preset value or more.

The interlock circuit is positioned within an electric vehicle, and thus may be the GND-short state in which a ground 520 and the interlock circuit are short-circuited. Specifically, in the case of a vehicle, such a failure mode may occur when part of the interlock circuit comes into contact with a vehicle body because the vehicle body itself made of metal functions as the ground.

This means that the ground 520 is connected to any one of both the ends 410 and 420 of the input terminal. Accordingly, an overall GND-short state of an electric vehicle may be represented as the circuit of FIG. 10a or 10b. Accordingly, it may be said that a part that belongs to various parts included in the electric vehicle and that is detected by the circuit failure detector of the present invention has a failure mode of the GND-short state in which the part and the ground are shorted.

From FIG. 11, the output signal of the first coupler and output signal of the second coupler of the present invention may be seen when the interlock circuit is the GND-short state. In the case of the GND-short state, the first coupler outputs a low voltage signal 0, and the second coupler outputs a preset value or more (High). Accordingly, the controller of the present invention may detect that a part of an electric vehicle is the GND-short state by detecting the output signals of the first coupler and the second coupler.

Furthermore, the controller 380 of the present invention may detect that the interlock circuit is a failure when the second frequency of the output signal of the first coupler 360 or the output signal of the second coupler 370 exceeds a preset range. A detection signal input to the input terminal of the present invention may be coupled with a counting signal to generate the final output signal. In the case of the normal state, the second frequency of the final output signal needs to be constantly output as in FIG. 5*b*.

However, when a part included in an electric vehicle or the counting signal generator itself is abnormal, abnormality may occur in the second frequency. More specifically, 55 times of highs/lows may alternately occur in the high state of the first frequency. However, when the part or the counting signal generator is abnormal, frequency abnormality in which 40 times or 100 times of highs/lows alternately occur may occur. The controller of the present invention may identify a failure mode of the electric vehicle by detecting the second frequency.

Furthermore, the circuit failure detector of the present invention may further include a given detection signal generator. The given detection signal generator may generate a given detection signal having a first frequency and input the given detection signal to the input terminal. In this case, the controller of the present invention may detect a circuit failure based on the output signal of the first coupler or the output signal of the second coupler generated based on the given detection signal.

The above-described detection signal is not generated by the circuit failure detector of the present invention, but is received from the interlock circuit. However, in another embodiment, the circuit failure detector of the present invention can autonomously generate a detection signal, and may detect a failure mode when the detection signal itself of the input terminal is damaged. Furthermore, the circuit failure detector can efficiently detect a failure mode of a vehicle part using a given detection signal without receiving a signal from the vehicle.

Meanwhile, the circuit failure detector of the present invention may be used in an electric vehicle charging controller 211 and may also be included in the electric vehicle 210.

The electric vehicle charging controller 211 according to an embodiment of the present invention includes a circuit failure detector, a power connector for receiving power from an electric vehicle charging station, a relay circuit connected to the power connector, and a power supply circuit connected to the relay circuit to supply power to the battery of an electric vehicle. The circuit failure detector includes the input terminal receiving a detection signal having a first frequency from the interlock circuit, the correction circuit correcting a voltage of the input detection signal, the first comparator outputting a high voltage signal or a low voltage signal by comparing the corrected detection signal with a first reference voltage, the second comparator inverting the corrected detection signal and outputting a high voltage signal or a low voltage signal by comparing the inverted detection signal with a second reference voltage, the counting signal generator generating a counting signal having a second frequency, the first coupler coupling the output signal of the first comparator and the counting signal, the second coupler coupling the output signal of the second comparator and the counting signal, and the controller detecting a circuit failure based on the output signal of the first coupler and the output signal of the second coupler. When the controller detects a circuit failure, the circuit failure detector may open the switch of the relay circuit.

The above-described circuit failure detector determines only a failure of a circuit included in an electric vehicle, and the configuration of additional measures according to a circuit failure may be implemented by the electric vehicle charging controller. To this end, the electric vehicle charging controller of the present invention may include the circuit failure detector, the power connector, the relay circuit, the power supply circuit.

When an electric vehicle is connected to a charging station and receives power, the power connector may receive the power and supply the power to the battery of the electric vehicle through the power supply circuit.

The electric vehicle charging controller of the present invention further includes the relay circuit, and converts the electric vehicle into a safety state by opening the switch of the relay circuit when the controller detects a circuit failure.

Meanwhile, the electric vehicle 210 according to an embodiment of the present invention includes an interlock circuit, a circuit failure detector, a power connector receiving power from an electric vehicle charging station, a relay circuit connected to the power connector, and a power supply circuit connected to the relay circuit to supply power to the battery of an electric vehicle. The power connector includes a power input port and an interlock port. The interlock circuit includes a detection signal generator generating a detection signal having a first frequency, at least one electronic part included in the electric vehicle, and a detection wire connected to the interlock port and the detection signal generator to form a closed loop. The circuit failure detector includes the input terminal receiving a detection signal having a first frequency from the interlock circuit, the correction circuit correcting a voltage of the input detection signal, the first comparator outputting a high voltage signal or a low voltage signal by comparing the corrected detection signal with a first reference voltage, the second comparator inverting the corrected detection signal and outputting a high voltage signal or a low voltage signal by comparing the inverted detection signal with a second reference voltage, the counting signal generator generating a counting signal having a second frequency, the first coupler coupling the output signal of the first comparator and the counting signal, the second coupler coupling the output signal of the second comparator and the counting signal, and the controller detecting a circuit failure based on the output signal of the first coupler and the output signal of the second coupler. When the controller detects a circuit failure, the circuit failure detector may open the switch of the relay circuit.

The electric vehicle may include various parts, and may include a detection wire connected to a corresponding part, the interlock port and the detection signal generator to form a closed loop. The circuit failure detector of the present invention may identify the charging state of the electric vehicle through the detection wire, and may identify a failure mode as in the above-described control method of the electric vehicle charging controller and implement it as the safety state of the electric vehicle through open control of the relay circuit.

In this case, the electric vehicle charging controller and the circuit failure detector included in the electric vehicle may be implemented to include all the elements and functions of the above-described circuit failure detector.

The above-described embodiments of the present invention have been disclosed for illustrative purposes, but the present invention is not restricted by the embodiments.

Furthermore, those skilled in the art to which the present invention pertains may modify and change the present invention in various ways within the spirit and scope of the present invention, and such modifications and changes should be construed as falling within the range of right of the present invention.

The invention claimed is:

1. A circuit failure detector, comprising:
an input terminal configured to receive a detection signal having a first frequency from an interlock circuit;
a correction circuit configured to correct a voltage of the input detection signal;
a first comparator configured to output a high voltage signal or a low voltage signal by comparing the corrected detection signal with a first reference voltage;
a second comparator configured to invert the corrected detection signal and to output a high voltage signal or a low voltage signal by comparing the inverted detection signal with a second reference voltage;
a counting signal generator configured to generate a counting signal having a second frequency;
a first coupler configured to couple the output signal of the first comparator and the counting signal;
a second coupler configured to couple the output signal of the second comparator and the counting signal; and
a controller configured to detect a circuit failure based on an output signal of the first coupler and an output signal of the second coupler.

2. The circuit failure detector of claim 1, wherein the correction circuit corrects the voltage of the input detection signal by adding an offset voltage to the voltage of the input detection signal.

3. The circuit failure detector of claim 1, wherein the controller detects that the interlock circuit is a circuit failure of an open state when an output signal of the first coupler and an output signal of the second coupler are low voltage signals.

4. The circuit failure detector of claim 1, wherein the controller detects that the interlock circuit is a circuit failure of a battery-short state when an output signal of the first coupler is a preset value or more and an output signal of the second coupler is a low voltage signal.

5. The circuit failure detector of claim 1, wherein the controller detects that the interlock circuit is a circuit failure of a ground (GND)-short state when an output signal of the first coupler is a low voltage signal and an output signal of the second coupler is a preset value or more.

6. The circuit failure detector of claim 1, wherein the controller detects that the interlock circuit is a failure when a second frequency of an output signal of the first coupler or output signal of the second coupler exceeds a preset range.

7. The circuit failure detector of claim 1, comprising a given detection signal generator configured to generate a given detection signal having the first frequency and to input the given detection signal to the input terminal.

8. The circuit failure detector of claim 7, wherein the controller detects a circuit failure based on an output signal of the first coupler or output signal of the second coupler generated based on the given detection signal.

9. A circuit failure detection method using a circuit failure detector, the method comprising:
receiving a detection signal having a first frequency from an interlock circuit;
correcting a voltage of the input detection signal;
outputting a first output signal including a high voltage signal or a low voltage signal based on a result of comparing a voltage of the corrected detection signal with a first reference voltage;
inverting the corrected detection signal;
outputting a second output signal including a high voltage signal or a low voltage signal based on a result of comparing a voltage of the inverted detection signal with a second reference voltage;
generating a counting signal having a second frequency;
coupling the first output signal and the counting signal;
coupling the second output signal output and the counting signal; and
determining a circuit failure based on a number of counting signals coupled with the first output signal and a number of counting signals coupled with the second output signal.

10. The circuit failure detection method of claim 9, wherein in the voltage of the input detection signal is corrected by adding an offset voltage to the voltage of the input detection signal.

11. The circuit failure detection method of claim 9, wherein the interlock circuit is determined as being a circuit failure of an open state when an output signal of the first coupler and an output signal of the second coupler are low voltage signals.

12. The circuit failure detection method of claim 9, wherein the interlock circuit is determined as being a circuit failure of a battery-short state when an output signal of the first coupler is a preset value or more and an output signal of the second coupler is a low voltage signal.

13. The circuit failure detection method of claim 9, wherein the interlock circuit is determined as being a circuit failure of a ground (GND)-short state when an output signal of the first coupler is a low voltage signal and an output signal of the second coupler is a preset value or more.

14. The circuit failure detection method of claim 9, wherein the interlock circuit is determined as being a failure when a second frequency of an output signal of the first coupler or output signal of the second coupler exceeds a preset range.

15. An electric vehicle charging controller, comprising:
a circuit failure detector;
a power connector configured to receive power from an electric vehicle charging station;
a relay circuit connected to the power connector; and
a power supply circuit connected to the relay circuit to supply power to a battery of an electric vehicle,
wherein the circuit failure detector comprises:
an input terminal configured to receive a detection signal having a first frequency from an interlock circuit;
a correction circuit configured to correct a voltage of the input detection signal;
a first comparator configured to output a high voltage signal or a low voltage signal by comparing the corrected detection signal with a first reference voltage;
a second comparator configured to invert the corrected detection signal and to output a high voltage signal or a low voltage signal by comparing the inverted detection signal with a second reference voltage;
a counting signal generator configured to generate a counting signal having a second frequency;
a first coupler configured to couple the output signal of the first comparator and the counting signal;
a second coupler configured to couple the output signal of the second comparator and the counting signal; and
a controller configured to detect a circuit failure based on an output signal of the first coupler and an output signal of the second coupler, and wherein when the controller detects a circuit failure, a switch of the relay circuit is open.

* * * * *